US005877633A

United States Patent [19]
Ng et al.

[11] Patent Number: 5,877,633
[45] Date of Patent: Mar. 2, 1999

[54] BIDIRECTIONAL VOLTAGE TRANSLATOR

[75] Inventors: Richard Ng, Cary; Matthew Duane Mottier, Lake Zurich; John Jerome Janssen, Round Lake Beach, all of Ill.

[73] Assignee: Motorola, Inc., Schaumburg, Ill.

[21] Appl. No.: 839,732

[22] Filed: Apr. 15, 1997

Related U.S. Application Data

[63] Continuation of Ser. No. 583,209, Jan. 3, 1996, abandoned.
[51] Int. Cl.[6] .............................................. H03K 19/0175
[52] U.S. Cl. ................................ 326/80; 326/81; 326/86
[58] Field of Search ................................. 326/21, 57–58, 326/63, 68, 80–81, 121, 86; 327/403, 404

[56] References Cited

U.S. PATENT DOCUMENTS

| 4,361,876 | 11/1982 | Groves . |
| 4,624,006 | 11/1986 | Rempfer et al. ........................... 377/69 |
| 4,680,491 | 7/1987 | Yokouchi et al. ..................... 326/58 X |
| 5,084,637 | 1/1992 | Gregor ...................................... 326/81 |
| 5,300,835 | 4/1994 | Assar et al. ......................... 326/121 X |
| 5,406,140 | 4/1995 | Wert et al. . |
| 5,428,800 | 6/1995 | Hsieh et al. . |
| 5,455,526 | 10/1995 | Runas .................................... 326/68 X |
| 5,521,531 | 5/1996 | Okuzumi .................................. 326/81 |

FOREIGN PATENT DOCUMENTS 1551595  8/1979  United Kingdom .

OTHER PUBLICATIONS

Philips Semiconductors, Jul. 1994; Octal dual supply translating transceiver; 3–state, 74LVC4245, pp. 3–137—3–142; 16–bit bus transceiver with direction pin; 3–state, 74LVC16245, pp. 5–18—5–21.

Primary Examiner—Jon Santamauro
Attorney, Agent, or Firm—Mark D. Patrick

[57] ABSTRACT

A bidirectional voltage translator (102) includes a first port (200/400), a second port (202/402) and a bidirectional translator circuit (208–215/404–408, 410, 412–415) coupled between the first and second ports (200/400,202/402). The first and second ports (200/400,202/402) communicate signals at a first voltage level and a second voltage level, respectively. The second voltage level is different from the first voltage level. When a first port signal input at the first voltage level at the first port (200/400) is detected, the bidirectional translator circuit (208–215/404–408, 410, 412–415) translates the first port signal into the second voltage level at the second port (202/402) and disables translation of a signal at the second port (202/402) to the first port (200/400). When a second port signal input at the second voltage level at the second port (202/402) is detected, the bidirectional translator circuit (208–215/404–408, 410, 412–415) translates the second port signal into the first voltage level at the first port (200/400) and disables translation of a signal at the first port (200/400) to the second port (202/402).

25 Claims, 5 Drawing Sheets

BIDIRECTIONAL VOLTAGE TRANSLATOR

This is a continuation of application Ser. No. 08/583,209, filed Jan. 3, 1996, and now abandoned.

FIELD OF THE INVENTION

The present invention relates generally to voltage translators and, more specifically, to a voltage translator that is bidirectional.

BACKGROUND OF THE INVENTION

Electronic systems employ voltage translators to interface electronic devices that operate at different voltage levels. Such voltage translators are sometimes bidirectional to facilitate transferring of data. Existing bidirectional voltage translators utilize a read/write control line to control the direction of data communication. The read/write control line is controlled by one of the electronic devices coupled to the bidirectional voltage translator. Due to hardware limitations, some electronic devices are unable to accommodate the read/write control line. Existing off-the-shelf cabling also does not accommodate the read/write control line. What is needed, therefore, is a bidirectional voltage translator that does not utilize a read/write control line.

It is also beneficial to implement a bidirectional voltage translator using low cost discrete components.

DETAILED DESCRIPTION OF THE PREFERRED EMBODIMENTS

A bidirectional voltage translator includes a first port, a second port and a bidirectional translator circuit coupled between the first and second ports. The first and second ports communicate signals at a first voltage level and a second voltage level, respectively. The second voltage level is different from the first voltage level. When a first port signal input at the first voltage level at the first port is detected, the bidirectional translator circuit translates the first port signal into the second voltage level at the second port and disables translation of a signal at the second port to the first port. When a second port signal input at the second voltage level at the second port is detected, the bidirectional translator circuit translates the second port signal into the first voltage level at the first port and disables translation of a signal at the first port to the second port. Unlike the prior art, the bidirectional voltage translator allows two electronic devices with incompatible voltage levels to communicate over a single bi-directional wire without using a separate control line.

Figure 1:
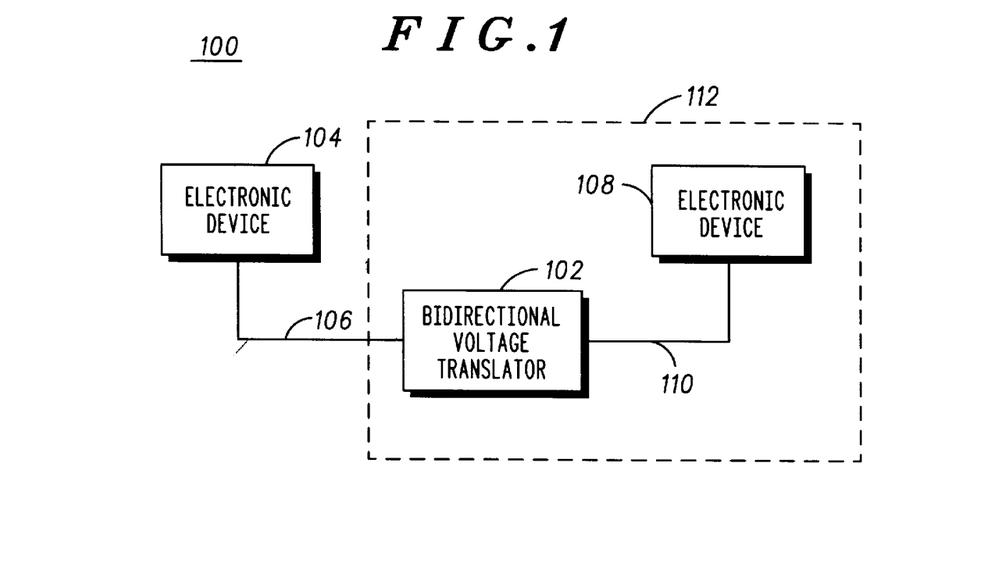
FIG. 1 illustrates an electronic system employing a bidirectional voltage translator.

FIG. 1 illustrates electronic system 100 employing bidirectional voltage translator 102. Electronic system 100 includes electronic device 104, wire 106, electronic device 108, and wire 110. Electronic device 104 operates at a first voltage level, such as 3 V. Wire 106 transfers signals at the first voltage level. Electronic device 108 operates at a second voltage level, such as 5V. Wire 110 transfers signals at the second voltage level. Electronic device 104 is detachably coupled to bidirectional voltage translator 102 via wire 106. Electronic device 108 is detachably coupled to bidirectional voltage translator 102 via wire 110. Bidirectional voltage translator 102 allows electronic devices 104, 108 to communicate over wires 110, 106, which form a single bidirectional wire, without using a separate direction control line to the translation, such as a translation read/write control line.

Electronic devices 104, 108 communicate using compatible protocols. Such protocols allow for recovery of communication from any data collisions. Electronic device 104 outputs communication signals having the first voltage level on wire 106. Bidirectional voltage translator 102 translates the voltage level of these signals to the second voltage level and couples the translated signals to electronic device 108 via wire 110. Electronic device 108 outputs communication signals having the second voltage level on wire 110. Bidirectional voltage translator 102 translates the voltage level of these signals to the first voltage level and couples the translated signals to electronic device 104 via wire 106.

Each one of electronic devices 104, 108 could be any one of a plurality of electronic devices including, but not limited to, a cellular radiotelephone, a cellular base station, a two-way radio, a pager, a personal digital assistant, a computer, a modem, a Personal Computer Memory Card International Association (PCMCIA) card, a subscriber identity module (SIM) card, a SIM card reader, a smart card, a smart card reader, a landline telephone, a battery charger, and the like, and "device" as used herein shall refer to each of these and their equivalents.

Field service of one of electronic devices 104, 108 can be accomplished via electronic system 100. For example, electronic system 100 could be used to transfer cellular radiotelephone system identification and operation data (Electronic Serial Number (ESN) and/or Number Assignment Module (NAM) data) from electronic device 104, which is a cellular radiotelephone that must be repaired, to electronic device 108, which is a loaner cellular radiotelephone, via bidirectional voltage translator 102. Electronic system 100 could be used to program such cellular radiotelephone system identification and operation data from electronic device 104, which is a computer or dedicated programming box, to electronic device 108, which is a cellular radiotelephone, via bidirectional voltage translator 102. Electronic system 100 could also be used to test the operation of electronic device 104 by coupling electronic device 108, which could be an individual piece or entire rack of test equipment, via bidirectional voltage translator 102.

Bidirectional voltage translator 102, wire 110, and electronic device 108 could be commercially packaged to provide an accessory, such as accessory 112, that is compatible with electronic device 104. In FIG. 1, the electronic circuitry comprising accessory 112 is illustrated as electronic device 108 and operates at a voltage level that is different from that of electronic device 104. Accessory 112 is detachably coupled to electronic device 104 via wire 106. Accessory 112 could be a vehicle accessory, such as a hands-free accessory for a cellular radiotelephone, a data accessory, such as a modem or a PCMCIA card, or other equivalent accessory.

Figure 2:
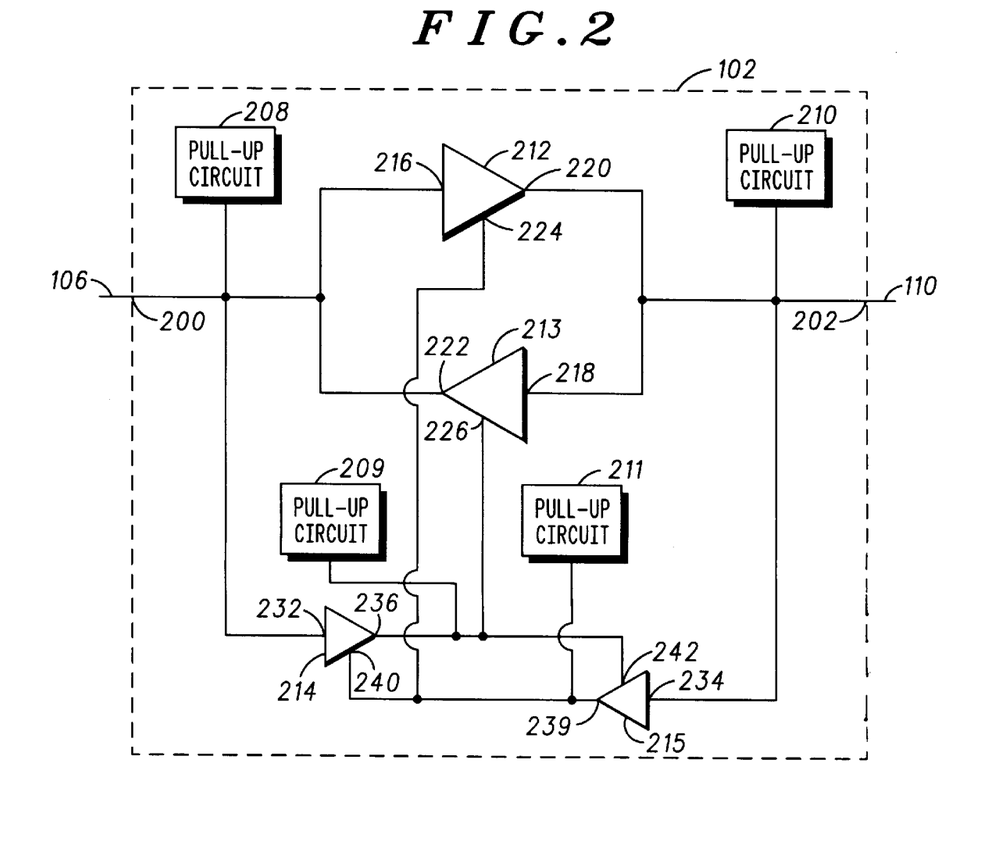
FIG. 2 illustrates a block diagram of an embodiment of the bidirectional voltage translator of FIG. 1.

Bidirectional voltage translator 102, implemented without a separate directional control line and with only discrete components, is illustrated in FIG. 2. Bidirectional voltage translator 102 of FIG. 2 comprises a bidirectional translator circuit including ports 200, 202, pull-up circuits 208–211, and buffers 212–215.

Ports 200, 202 are characterized by the voltage level of wires 106, 110, respectively. Ports 200, 202 receive signals to be translated from wires 106, 110, respectively. Port 200 is coupled to wire 106, pull-up circuit 208, and buffers 212, 213, 214. Port 202 is coupled to wire 110, pull-up circuit 210, and buffers 212, 213, 215.

Buffers 212, 213 translate the voltage levels of signals at ports 200, 202. Buffers 212, 213 are unidirectional and include respective inputs 216, 218, outputs 220, 222, and enable ports 224, 226. Input 216 of buffer 212 and output 222 of buffer 213 are coupled to port 200. Output 220 of buffer 212 and input 218 of buffer 213 are coupled to port 202. Enable ports 224, 226 of buffers 212, 213, respectively, are coupled to buffers 214, 215.

Buffers 214, 215 control the direction of translation of buffers 212, 213. Buffers 214, 215 are unidirectional and include respective inputs 232, 234, outputs 236, 238, and enable ports 240, 242. Input 232 of buffer 214 is coupled to port 200. Input 234 of buffer 215 is coupled to port 202. Output 236 of buffer 214 is coupled to enable port 242 of buffer 215, pull-up circuit 209, and enable port 226 of buffer 213. Output 238 of buffer 215 is coupled to enable port 240 of buffer 214, pull-up circuit 211, and enable port 224 of buffer 212.

Buffers 212, 213, 214, 215 are non-inverting open-drain or open-collector buffers. Buffers 212, 213, 214, 215 are enabled to translate the voltage levels of signals when enable ports 224, 226, 240, 242, respectively, are pulled to a high voltage level. Buffers 212, 213, 214, 215 are disabled when enable ports 224, 226, 240, 242, respectively, are pulled to a low voltage level.

Bidirectional voltage translator 102 is in an idle state when no signals are present to translate at either port 200 or port 202. In the idle state, pull-up circuits 208, 210 pull-up wires 106, 110 and ports 200, 202, respectively, to their requisite voltage levels. If bidirectional voltage translator 102 is a 3V to 5V translator, pull-up circuit 208 pulls up wire 106 and port 200 to 3V and pull-up circuit 210 pulls up wire 110 and port 202 to 5V. Pull-up circuits 209, 211 enable buffers 212, 213, 214, 215 by pulling up enable ports 224, 226, 240, 242, respectively, to the high voltage level.

When a signal to be translated originates at port 200, buffer 214 turns on. Once on, buffer 214 drives both enable port 226 of buffer 213 and enable port 242 of buffer 215 to the low voltage level. This disables buffers 213, 215 to disable communication of signals input at port 202 to port 200. Once disabled, the voltage level of the signal is translated by buffer 212 into the voltage level characterizing port 202 and wire 110. The translated signal is output to port 202. By disabling buffers 213, 215 during translation from port 200 to port 202, the translated signal or another signal at port 202 is prevented from disabling buffer 213 and/or pulling down and latching port 200 and wire 106 through buffer 213.

When a signal to be translated originates at port 202, buffer 215 turns on. Once on, buffer 215 drives both enable port 224 of buffer 212 and enable port 240 of buffer 214 to the low voltage level. This disables buffers 212, 214 to disable communication of signals input at port 200 to port 202. The voltage level of the signal is then translated by buffer 213 into the voltage level characterizing port 200 and wire 106. By disabling buffers 212, 214 during translation from port 202 to port 200, the translated signal or another signal at port 200 is prevented from disabling buffer 212 and/or pulling down and latching port 202 and wire 110 through buffer 212.

If signals to be translated originate at ports 200, 202 simultaneously, all buffers 212, 213, 214, 215 will become disabled. Buffers 212, 213, 214, 215 will remain disabled until signals at ports 200, 202 are released by their respective electronic devices 104, 108 of FIG. 1.

Aside from disabling buffers, latch-up or lock-up of bidirectional voltage translator 102 is further avoided by fabricating buffers 212, 213 to have a larger propagation delay than the propagation delay of buffers 214, 215. Aside from fabrication, propagation delay could be increased by coupling additional delay buffers in series with buffers 212, 213.

Figure 3:
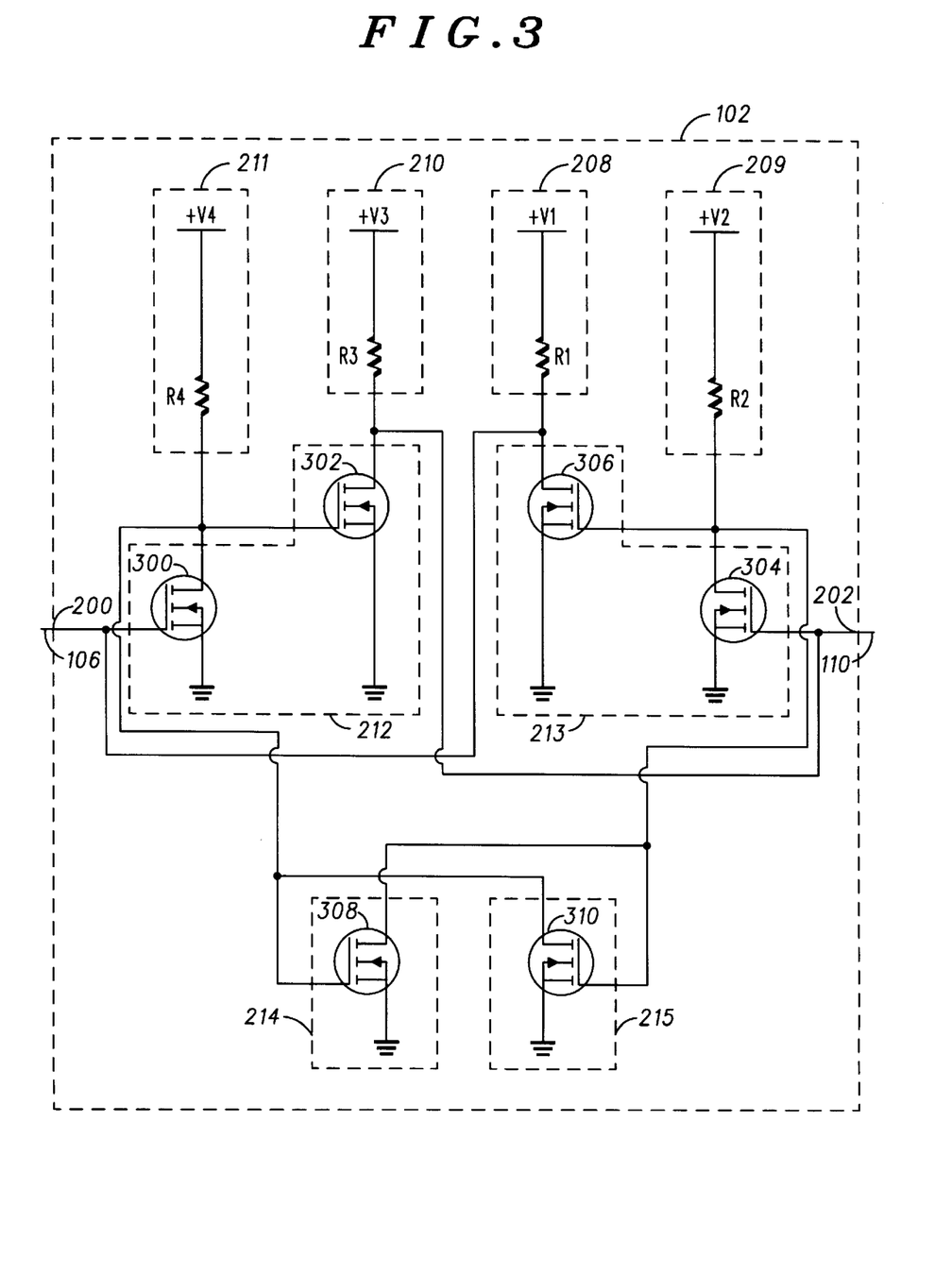
FIG. 3 illustrates a circuit schematic of the embodiment of FIG. 2.

A circuit representation of bidirectional voltage translator 102 of FIG. 2 is illustrated in FIG. 3. Buffers 212, 213 include transistors 300, 302 and transistors 304, 306, respectively. Buffers 214, 215 include transistors 308, 310, respectively. Each one of transistors 300, 302, 304, 306, 308, 310 is preferably an n-channel enhancement mode MOSFET (metal-oxide semiconductor field effect transistor) and includes a gate, a drain, and an intercoupled base and source that is further coupled to electrical ground.

Transistors 300, 302, 304, 306, 308, 310 are connected as follows. The gate of transistor 300 of buffer 212 is coupled to port 200. The drain of transistor 300 is coupled to the gate of transistor 302 of buffer 212, the gate of transistor 308 of buffer 214, and the drain of transistor 310 of buffer 215. The drain of transistor 302 of buffer 212 is coupled to port 202. The gate of transistor 304 of buffer 213 is coupled to port 202. The drain of transistor 304 is coupled to the gate of transistor 306 of buffer 213, the gate of transistor 310 of buffer 215, and the drain of transistor 308 of buffer 214. The drain of transistor 306 of buffer 213 is coupled to port 200. The drain of transistor 308 of buffer 214 is coupled to the gate of transistor 310 of buffer 215. The drain of transistor 310 is coupled to the gate of transistor 308.

Pull-up circuits 208–211 include respective power supplies +V1, +V2, +V3, +V4 and respective resistors R1, R2, R3, R4. Pull-up circuit 208 is coupled to port 200 and the drain of transistor 306 of buffer 213. Pull-up circuit 209 is coupled to the gates of transistors 306, 310 of buffers 213, 215, respectively, and to the drains of transistors 304, 308 of buffers 213, 214, respectively. Pull-up circuit 210 is coupled to port 202 and the drain of transistor 302 of buffer 212. Pull-up circuit 211 is coupled to the gates of transistors 302, 308 of buffers 212, 214, respectively, and to the drains of transistors 300, 310 of buffers 212, 215, respectively. If bidirectional voltage translator 102 is a 3V to 5V translator, suitable values for power supplies +V1, +V2, +V3, +V4 are 3V, 5V, 5V, and 5V, respectively, and a suitable value for resistors R1, R2, R3, R4 is 10 kΩ.

In the idle state, port 200 is pulled up to voltage +V1 via pull-up circuit 208 and the open drain of transistor 306. Similarly, port 202 is pulled up to voltage +V3 via pull-up circuit 210 and the open drain of transistor 302. Buffers 212, 213, 214, 215 are effectively enabled via pull-up circuits 209, 211 and the open drains of transistors 300, 304, 308, 310.

When translation is initiated by the signal at port 200, the voltage at the gate of transistor 300 of buffer 212 goes to a low level. This causes transistor 300 to turn on and the drain of transistor 300 to go to a high voltage level. The high voltage level at the drain of transistor 300 causes the voltage at the gates of transistors 302, 308 to also go to a high level. In response, the drains of transistors 302, 308 are pulled to a low voltage level. The pulling of the drain of transistor 302 to a low level translates the signal and communicates the translated signal to port 202. The pulling of the drain of transistor 308 to a low level disables transistors 304, 306, 310 by setting the drain of transistor 304 and the gates of transistors 306, 310 to a low voltage level. The drains of transistors 306, 310 become open.

When translation is initiated by the signal at port 202, the voltage at the gate of transistor 304 of buffer 213 goes to a low level. This causes transistor 304 to turn on and the drain of transistor 304 to go to a high voltage level. The high voltage level at the drain of transistor 304 causes the voltage at the gates of transistors 306, 310 to also go to a high level. In response, the drains of transistors 306, 310 are pulled to a low voltage level. The pulling of the drain of transistor 306 to a low level translates the signal and communicates the translated signal to port 200. The pulling of the drain of transistor 310 to a low level disables transistors 300, 302, 308 by setting the drain of transistor 300 and the gates of transistors 302, 308 to a low voltage level. The drains of transistors 302, 308 become open.

When translation is simultaneously initiated by signals at both ports 200, 202, transistors 300, 304 drive transistors 308, 310, respectively, such that the drains of transistors 308, 310 are simultaneously pulled to the low voltage level. This causes the drains of transistors 302, 306 to become open. Transistors 302, 306 will remain in this state until the signals at ports 200, 202 are released by their respective electronic devices 104, 108 of FIG. 1.

Figure 4:
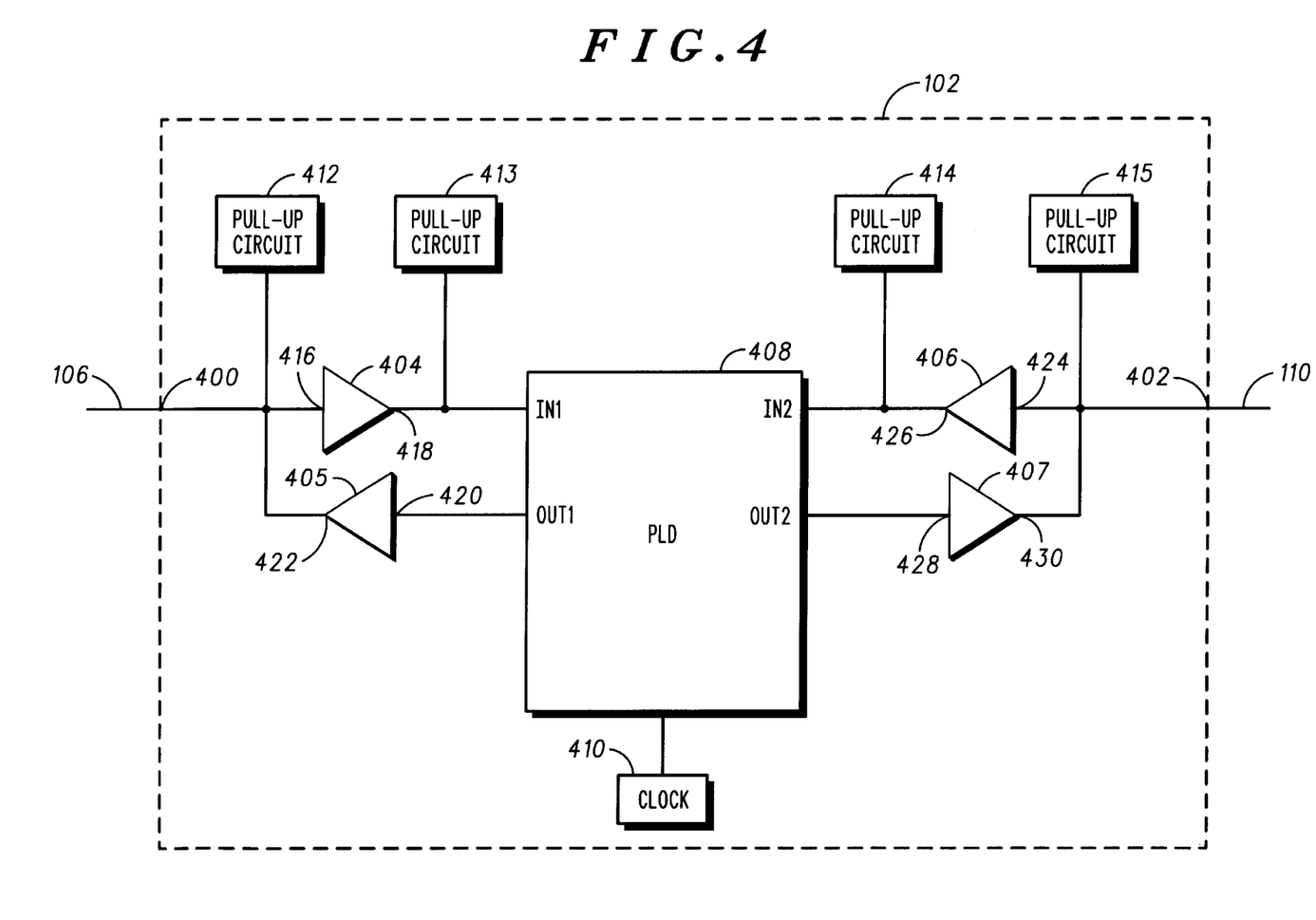
FIG. 4 illustrates a block diagram of an alternate embodiment of the bidirectional voltage translator of FIG. 1.

An alternate embodiment of bidirectional voltage translator 102, which is also implemented without a separate directional control line, is illustrated in FIG. 4. Bidirectional voltage translator 102 of FIG. 4 comprises a bidirectional translator circuit including ports 400, 402, buffers 404–407, programmable logic device (PLD) 408, clock 410, and pull-up circuits 412–415. Ports 400, 402 are characterized by the voltage level of wires 106, 110, respectively. Ports 400, 402 receive data signals to be translated from wires 106, 110, respectively.

Buffer 404 operates as a comparator that detects the presence of an incoming data signal to be translated at port 400. Buffer 404 includes input 416 and output 418. Input 416 of buffer 404 is coupled to port 400 and pull-up circuit 412. Output 418 of buffer 404 is coupled to pull-up circuit 413 and port IN1 of PLD 408. When the data signal to be translated is detected by buffer 404, a high voltage level is output to port IN1; otherwise, a low voltage level is output to port IN1.

Buffer 405 translates the voltage level of data signals originating at port 402. Buffer 405 includes input 420 and output 422. Input 420 of buffer 405 is coupled to port OUT1 of PLD 408. Output 422 of buffer 405 is coupled to port 400 and pull-up circuit 412. Buffer 405 turns on and translates data signals originating at port 402 into outgoing translated data signals when port OUT1 is set to a high voltage level by PLD 408. When port OUT1 is set to a low voltage level by PLD 408, buffer 405 remains off.

Buffer 406 operates as a comparator that detects the presence of an incoming data signal to be translated at port 402. Buffer 406 includes input 424 and output 426. Input 424 of buffer 406 is coupled to port 402 and pull-up circuit 415. Output 426 of buffer 406 is coupled to pull-up circuit 414 and port IN2 of PLD 408. When the data signal to be translated is detected by buffer 406, a high voltage level is output to port IN2; otherwise, a low voltage level is output to port IN2.

Buffer 407 translates the voltage level of data signals originating at port 400. Buffer 407 includes input 428 and output 430. Input 428 of buffer 407 is coupled to port OUT2 of PLD 408. Output 430 of buffer 407 is coupled to port 402 and pull-up circuit 415. Buffer 407 turns on and translates data signals originating at port 400 into outgoing translated data signals when port OUT2 is set to a high voltage level by PLD 408. When port OUT2 is set to a low voltage level by PLD 408, buffer 407 remains off.

Figure 5:
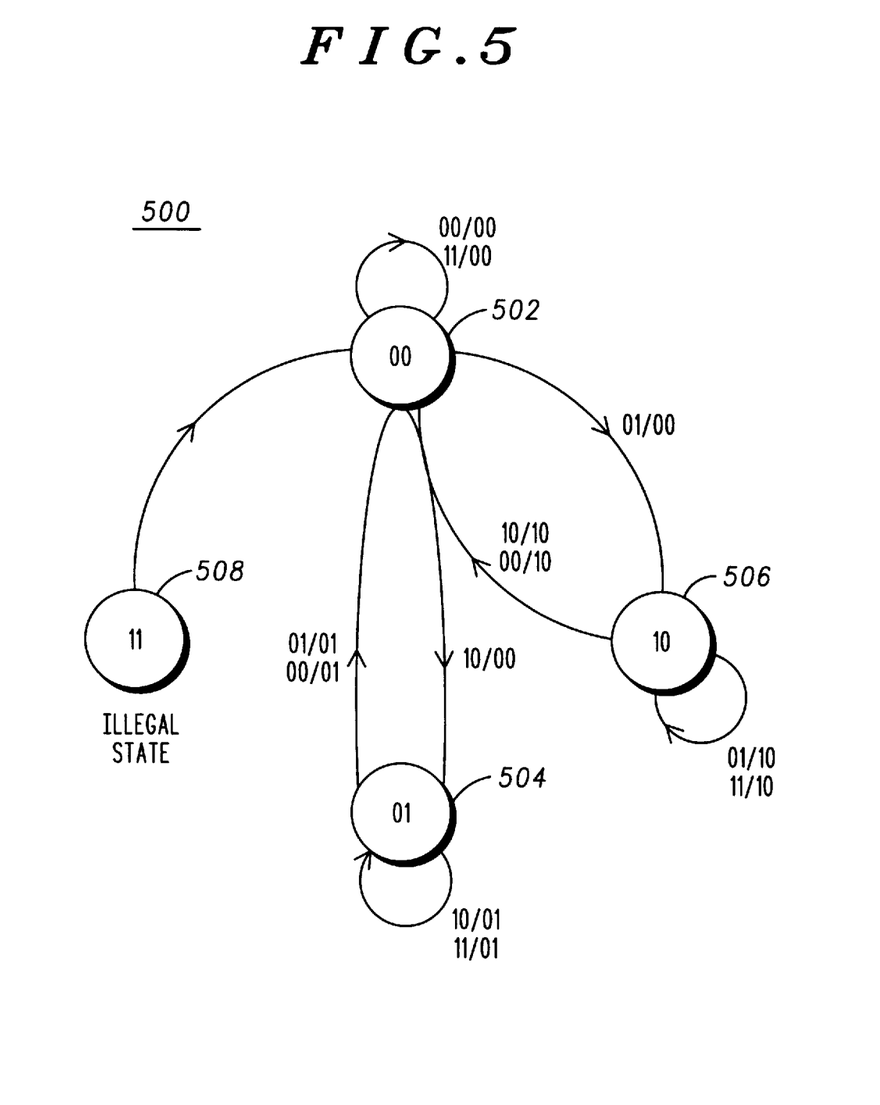
FIG. 5 illustrates a state diagram of a process for controlling data direction employed by the alternate embodiment of FIG. 4.

PLD 408 controls the direction of data signal translation of bidirectional voltage translator 102 according to a state machine 500 illustrated in FIG. 5. State machine 500 is implemented according to software stored in the PLD 408 of FIG. 4. Each state of state machine 500 represents the direction of data signal translation. Block 502 indicates an idle state where no data signal translation is occurring. Block 504 indicates a state where data signals received at port 400 of FIG. 4 are translated and output to port 402 of FIG. 4. Block 506 indicates a state where data signals received at port 402 of FIG. 4 are translated and output to port 402. Block 508 indicates an illegal state. In the event of reaching block 508, state machine 500 reverts to block 502.

State machine 500 operates synchronously in accordance with a continuous train of clock pulses provided by clock 410 to PLD 408. State evaluation and traversal occurs with the detection of each clock pulse. States are traversed based on the voltage levels of ports IN1, IN2, OUT1, OUT2 of PLD 408 of FIG. 4. State machine 500 remains at block 502 when ports IN1, IN2, OUT1, OUT2 are at a low voltage level, denoted in FIG. 5 as 00/00. State machine 500 also remains at block 502 when ports IN1, IN2 are at a high voltage level and ports OUT1, OUT2 are at a low voltage level, denoted as 11/00. State machine 500 moves from block 502 to block 504 when port IN1 is at a high voltage level and ports IN2, OUT1, OUT2 are at a low voltage level, denoted as 10/00. State machine 500 moves from block 502 to block 506 when port IN2 is at a high voltage level and ports IN1, OUT1, OUT2 are at a low voltage level, denoted as 01/00.

State machine 500 remains at block 504 when ports IN1, OUT2 of FIG. 4 are at a high voltage level and ports IN2, OUT1 of FIG. 4 are at a low voltage level, denoted in FIG. 5 as 10/01. State machine 500 also remains at block 504 when ports IN1, IN2, OUT2 are at a high voltage level and port OUT1 is at a low voltage level, denoted as 11/01. State machine 500 moves from block 504 to block 502 when ports IN2, OUT2 are at a high voltage level and ports IN1, OUT1 are at a low voltage level, denoted as 01/01. State machine 500 also moves from block 504 to block 502 when port OUT2 is at a high voltage level and ports IN1, IN2, OUT1 are at a low voltage level, denoted as 00/01.

State machine 500 remains at block 506 when ports IN2, OUT1 of FIG. 4 are at a high voltage level and ports IN1, OUT2 of FIG. 4 are at a low voltage level, denoted in FIG. 5 as 01/10. State machine 500 also remains at block 506 when ports IN1, IN2, OUT1 are at a high voltage level and port OUT2 is at a low voltage level, denoted as 11/10. State machine 500 moves from block 506 to block 502 when ports IN1, OUT1 are at a high voltage level and ports IN2, OUT2 are at a low voltage level, denoted as 10/10. State machine 500 also moves from block 506 to block 502 when port OUT1 is at a high voltage level and ports IN1, IN2, OUT2 are at a low voltage level, denoted as 00/10.

Although state machine 500 is implemented via PLD 408, it will be recognized that state machine 500 could also be implemented using a microprocessor or discrete components, such as flip flops.

Figure 6:
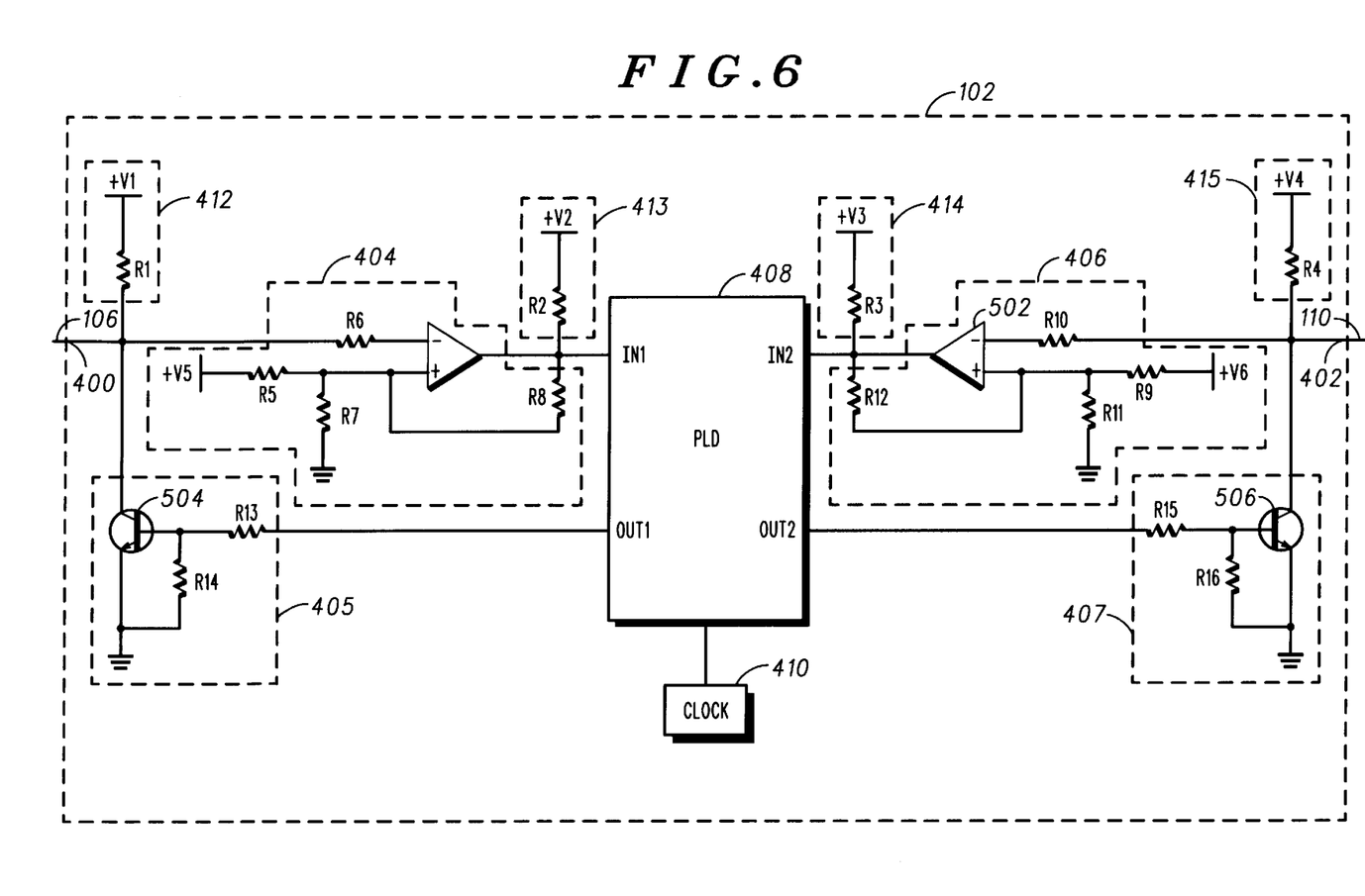
FIG. 6 illustrates a circuit schematic of the alternate embodiment of FIG. 5.

A partial circuit representation of bidirectional voltage translator 102 of FIG. 4 is illustrated in FIG. 6. Buffers 404, 406 include comparators 500, 502, respectively. Buffers 405, 407 include transistors 504, 506, respectively. Pull-up circuits 412–415 include respective power supplies +V1, +V2, +V3, +V4 and respective resistors R1, R2, R3, R4. If bidirectional voltage translator 102 is a 3V to 5V translator, suitable values for power supplies +V1, +V2, +V3, +V4 include 3V, 5V, 5V, and 5V, respectively, and suitable values for resistors R1, R2, R3, R4 include 100 kΩ, 10 kΩ, 10 kΩ, and 15 kΩ, respectively. It will be recognized that other values for resistors R1–R4 can be used.

Comparators 500, 502 are coupled between ports 400, 402, respectively, and PLD 408, to compare the voltage level of incoming data signals from ports 400, 402, respectively, to a voltage level derived from voltage references +V5, +V6, respectively. When the voltage level of the incoming data signal at port 400 in conjunction with resistor R6 is greater than or approximately equal to a voltage level derived from +V5, resistors R5, R7, R8, and the output voltage level of comparator 500, comparator 500 outputs a low voltage level to port IN1 of PLD 408. When the voltage level of the incoming data signal at port 402 in conjunction with resistor R10 is greater than or approximately equal to a voltage level derived from +V6, resistors R9, R11, R12, and the output voltage level of comparator 502, comparator 502 outputs a low voltage level to port IN2 of PLD 408. If bidirectional voltage translator 102 is a 3V to 5V translator, suitable values for voltage references +V5, +V6 are 3V and 5V, respectively, and suitable values for resistors R5, R6, R7, R8, R9, R10, R11, R12 are 10 kΩ, 10 kΩ, 10 kΩ, 100 kΩ, 10 kΩ, 10 kΩ, 10 kΩ, and 100 kΩ, respectively. It will be recognized that other values for resistors R5–R12 can be used.

Transistors 504, 506, responsive to PLD 408, translate the incoming data signals from ports 402, 400, respectively, and couple the translated data signals to ports 400, 402, respectively. Transistors 504, 506 are open-collector bipolar junction transistors that include a base, a collector, and an emitter. The bases of transistors 504, 506 are coupled to ports OUT1, OUT2 of PLD 408, respectively. If an incoming signal from port 402 is to be translated, PLD 408 outputs a high voltage signal via port OUT2 to turn on transistor 506. Transistor 506, in conjunction with resistors R15, R16, generates the translated voltage level of the incoming signal at port 402. If an incoming signal from port 400 is to be translated, PLD 408 outputs a high voltage signal via port OUT1 to turn on transistor 504. Transistor 504, in conjunction with resistors R13, R14, generates the translated voltage level of the incoming signal at port 402. If bidirectional voltage translator 102 is a 3V to 5V translator, suitable values for resistors R13, R14, R15, R16 include 2.2 kΩ, 10 kΩ, 2.2 kΩ, and 10 kΩ, respectively. It will be recognized that other values or resistors R13–R16 can be used.

Bidirectional voltage translator 102 has been illustrated in FIGS. 1–6 as being drawn to a single wire. That is, wires 106, 110 illustrate single bidirectional wires. It will be recognized that the above implementations could be compatible with buses employing multiple wires, such as the Three-Wire Bus utilized in radiotelephone products manufactured and sold by Motorola, Inc. For example, the entire embodiment of FIGS. 2 and 3 can be replicated for each additional line of a multiple line bus. Alternatively, the buffers can be repeated and a single buffer, such as buffer 214 of FIG. 2, can be used to control the buffers in one direction and another single buffer, such as buffer 215 of FIG. 2, can be used to control the buffers in the other direction. With respect to the embodiment of FIGS. 4–6, all of the components except the PLD and clock would be replicated for each additional line of a multiple line bus. That is, each additional line requires four buffers, four pull-up circuits, and a state machine.

Therefore, a bidirectional voltage translator can be implemented that allows two electronic devices with incompatible voltage levels to communicate over a single bi-directional wire without using a separate directional control line. This allows the bidirectional voltage translator to be utilized without adding additional wires to existing cabling or additional hardware to electronic devices. The bidirectional voltage translator can utilize a synchronous state machine or discrete components to determine the direction of data translation based solely on the detection of signals at ports. Once the data direction is determined, the bidirectional voltage translator guards against latch-up by disabling the portion of the translator not being used to translate the data.

What is claimed is:

1. A bidirectional voltage translator comprising:
    a first port to communicate a signal at a first voltage level;
    a second port to communicate a signal at a second voltage level, the second voltage level different from the first voltage level; and
    a bidirectional translator circuit coupled to the first port and the second port, the bidirectional translator circuit comprising:
        translating circuitry to translate a first port signal input at the first voltage level at the first port into the second voltage level at the second port and to translate a second port signal input at the second voltage level at the second port into the first voltage level at the first port, and
        disabling circuitry, the disabling circuitry, when the first port signal is input at the first port disabling the translating circuitry from translating a signal at the second port to the first port and disabling the disabling circuitry from disabling the translating circuitry translating the first port signal, and the disabling circuitry, when the second port signal is input at the second port, disabling the translating circuitry from translating a signal at the first port to the second port and disabling the disabling circuitry from disabling the translating circuitry translating the second port signal.

2. A bidirectional voltage translator according to claim 1 wherein
    the translating circuitry comprises a first translating device and a second translating device, the first translating device to translate the first port signal, and the second translating device to translate the second port signal, and
    the disabling circuitry comprises a first disabling device and a second disabling device, the first disabling device, during translation of the first port signal, to disable the second disabling device and to disable the second translating device, the second disabling device, during translation of the second port signal, to disable the first disabling device and to disable the first translating device.

3. A bidirectional voltage translator according to claim 2 wherein
    the first translating device comprises a first buffer having a first input, a first output, and a first enable port, the first input coupled to the first port, the first output coupled to the second port, and the first enable port coupled to the second disabling device, and the second translating device comprises a second buffer having a second input, a second output, and an second enable port, the second input coupled to the second port, the second output coupled to the first port, the second enable port coupled to the first disabling device.

4. A bidirectional voltage translator according to claim 3, wherein the first disabling device comprises a third buffer having a third input, a third output, and a third enable port, the third input coupled to the first port, the third output coupled to the second enable port, and the third enable port coupled to the second disabling device, and the second disabling device comprises a fourth buffer having a fourth input, a fourth output, and a fourth enable port, the fourth input coupled to the second port, the fourth output coupled to the first enable port and to the third enable port, and the fourth enable port coupled to the third output.

5. A bidirectional voltage translator according to claim 1 wherein the bidirectional translator circuit further comprises:

a first pull-up circuit coupled to the first port, the first pull-up circuit setting the first port to the first voltage level when the first port signal is absent; and a second pull-up circuit coupled to the second port, the second pull-up circuit setting the second port to the second voltage level when the second port signal is absent.

6. A bidirectional voltage translator according to claim 5 wherein the bidirectional translator circuit further comprises:

a third pull-up circuit coupled to the translating circuitry, the third pull-up circuit setting the translating circuitry to enable translation of the second port signal; and a fourth pull-up circuit coupled to the translating circuitry, the fourth pull-up circuit setting the translating circuitry to enable translation of the first port signal.

7. A bidirectional voltage translator according to claim 1 wherein the translating circuitry has a first propagation delay, and the disabling circuitry has a second propagation delay less than the first propagation delay.

8. A bidirectional voltage translator according to claim 1 wherein the bidirectional translator circuit comprises only discrete components.

9. A bidirectional voltage translator according to claim 1 wherein the bidirectional translator circuit lacks a directional control line.

10. A bidirectional voltage translator according to claim 3 wherein the first input of the first buffer is coupled to the second output of the second buffer via a first wire, and the first output of the first buffer is coupled to the second input of the second buffer via a second wire.

11. A bidirectional voltage translator according to claim 1 wherein the translating circuitry comprises:

a first transistor having a first terminal coupled to the first port and a second terminal coupled to the disabling circuitry;

a second transistor having a first terminal coupled to the second terminal and a second terminal coupled to the second port;

a third transistor having a first terminal coupled to the second port and a second terminal coupled to the disabling circuitry; and a fourth transistor having a first terminal coupled to the second terminal of the third transistor and a second terminal coupled to the first port.

12. A bidirectional voltage translator according to claim 11 wherein the first, second, third and fourth transistors are MOSFETs (metal-oxide semiconductor field effect transistors), the first terminals of the first, second, third and fourth transistors are gates, and the second terminals of the first, second, third and fourth transistors are drains.

13. A bidirectional voltage translator according to claim 11 wherein the bidirectional translator circuit further comprises:

a first pull-up circuit comprising a first power supply and a first resistor, the first resistor having one end coupled to the first power supply and the other end coupled to the second terminal of the fourth transistor and to the first port; and a second pull-up circuit comprising a second power supply and a second resistor, the second resistor having one end coupled to the second power supply and the other end coupled to the second terminal of the second transistor and to the second port.

14. A bidirectional voltage translator according to claim 11 wherein the disabling circuitry comprises:

a first transistor having a first terminal coupled to the second terminal of the first transistor of the translating circuitry and a second terminal coupled to the second terminal of the third transistor of the translating circuitry; and a second transistor having a first terminal coupled to the second terminal of the first transistor of the disabling circuitry and a second terminal coupled to the first terminal of the first transistor of the disabling circuitry.

15. A bidirectional voltage translator according to claim 14 wherein the first and second transistors of the disabling circuitry are MOSFETs, the first terminals of the first and second transistors of the disabling circuitry are gates, and the second terminals of the first and second transistors of the disabling circuitry are drains.

16. A bidirectional voltage translator according to claim 14 wherein the bidirectional translator circuit further comprises:

a third pull-up circuit comprising a third power supply and a third resistor, the third resistor having one end coupled to the third power supply and the other end coupled to all of the first terminal of the fourth transistor of the translating circuitry, the first terminal of the second transistor of the disabling circuitry, the second terminal of the third transistor of the translating circuitry and the second terminal of the first transistor of the disabling circuitry; and a fourth pull-up circuit comprising a fourth power supply and a fourth resistor, the fourth resistor having one end coupled to the fourth power supply and the other end coupled to all of the first terminal of the second transistor of the translating circuitry, the first terminal of the first transistor of the disabling circuitry, the second terminal of the first transistor of the translating circuitry and the second terminal of the second transistor of the disabling circuitry.

17. A bidirectional voltage translator comprising:

a first port to communicate a signal at a first voltage level;

a second port to communicate a signal at a second voltage level, the second voltage level different from the first voltage level; and a bidirectional translator circuit coupled to the first port and the second port, the bidirectional translator circuit including circuitry to detect a first one of a first port signal input at the first voltage level at the first port and a second port signal input at the second voltage level at the second port and to disable communication of the other one of the first port signal and the second port signal while the first one is present, the bidirectional translator circuit, upon detecting the first port signal, translating the first port signal into the second voltage level at the second port and disabling translation of a signal at the second port to the first port, and the bidirectional translator circuit, upon detecting the second port signal, translating the second port signal into the first voltage level at the first port and disabling translation of a signal at the first port to the second port, and wherein the circuitry to detect comprises a state machine.

18. An accessory comprising:

accessory circuitry operating at a first voltage level;

a first port to communicate signals at the first voltage level;

a second port to connect to an electronic device, the second port to communicate signals at a second voltage level, the second voltage level different from the first voltage level; and a bidirectional translator circuit coupled to the first port and the second port, the bidirectional translator circuit comprising:

first and second translating devices, the first translating device to translate a first port signal input at the first voltage level at the first port from the electronic device into the second voltage level at the second port, and the second translating device to translate a second port signal input at the second voltage level at the second port from the accessory circuitry into the first voltage level at the first port, and first and second disabling devices, the first disabling device, when the first port signal is input at the first port, disabling the second translating device to prevent translation of a signal at the second port to the first port and disabling the second disabling device to prevent disabling of the first translating device, and the second disabling device, when the second port signal is input at the second port, disabling the first translating device to prevent translation of a signal at the first port to the second port and disabling the first disabling device to prevent disabling of the second translating device.

19. An accessory according to claim 18 wherein the first translating device comprises a first buffer having an input coupled to the first port, an output coupled to the second port, and an enable port, the second translating device comprises a second buffer having an input coupled to the output of the first buffer and to the second port, an output coupled to the input of the first buffer and to the first port, and an enable port, the first disabling device comprises a third buffer having an input coupled to the first port, an output coupled to the enable port of the second buffer, and an enable port coupled to the enable port of the first buffer, the second disabling device comprises a fourth buffer having an input coupled to the second port, an output coupled to the enable port of the first buffer and to the enable port of the third buffer, and an enable port coupled to the output of the third buffer and to the enable port of the second buffer, and the bidirectional translator circuit further comprises:

a first pull-up circuit coupled to all of the first port, the input of the first and third buffers and the output of the second buffer, a second pull-up circuit coupled to all of the second port, the inputs of the second and fourth buffers and the output of the first buffer, a third pull-up circuit coupled to the output of the third buffer and to the enable ports of the second and fourth buffers, and a fourth pull-up circuit coupled to the output of the fourth buffer and to the enable ports of the first and third buffers.

20. An accessory according to claim 18 wherein the first translating device comprises a first MOSFET and a second MOSFET, the gate of the first MOSFET coupled to the first port, the drain of the first MOSFET coupled to the gate of the second MOSFET, and the drain of the second MOSFET coupled to the second port, the second translating device comprises a third MOSFET and a fourth MOSFET, the gate of the third MOSFET coupled to the second port, the drain of the third MOSFET coupled to the gate of the fourth MOSFET, and the drain of the fourth MOSFET coupled to the first port, the first disabling device comprises a fifth MOSFET, the gate of the fifth MOSFET coupled to the drain of the first MOSFET and the gate of the second MOSFET, the drain of the fifth MOSFET is coupled to the drain of the third MOSFET and the gate of the fourth MOSFET, the first disabling device comprises a sixth MOSFET, the gate of the sixth MOSFET coupled to the drain of the fifth MOSFET, the drain of the sixth MOSFET is coupled to the gate of the fifth MOSFET, and the bidirectional translator circuit further comprises:

a first pull-circuit comprising a first power supply and a first resistor, the first resistor having one end coupled to the first power supply and the other end coupled to the drain of the fourth MOSFET and to the first port, a second pull-circuit comprising a second power supply and a second resistor, the second resistor having one end coupled to the second power supply and the other end coupled to the drain of the second MOSFET and to the second port, a third pull-circuit comprising a third power supply and a third resistor, the third resistor having one end coupled to the third power supply and the other end coupled to the gates of the fourth and sixth MOSFETs and to the drains of the third and fifth MOSFETs, and a fourth pull-circuit comprising a fourth power supply and a fourth resistor, the fourth resistor having one end coupled to the fourth power supply and the other end coupled to the gates of the second and fifth MOSFETs and to the drains of the first and sixth MOSFETs.

21. A bidirectional voltage translator comprising:

a first port to communicate a signal at a first voltage level;

a second port to communicate a signal at a second voltage level, the second voltage level different from the first voltage level; and a bidirectional translator circuit coupled to the first port and the second port, the bidirectional translator circuit comprising:

- detecting circuitry coupled to the first port and the second port, the detecting circuitry to detect a first port signal input at the first voltage level at the first port and to detect a second port signal input at the second voltage level at the second port,
- translating circuitry coupled to the first port and the second port, the translating circuitry to generate the first voltage level at the first port and to generate the second voltage level at the second port, and
- a programmable logic device coupled to the detecting circuitry and the translating circuitry, the programmable logic device, responsive to detection of the first port signal, driving the translating circuitry to generate the second voltage level at the second port, the programmable logic device, responsive to detection of the second port signal, driving the translating circuitry to generate the first voltage level at the first port, thereby facilitating bidirectional voltage translation.

22. A bidirectional voltage translator according to claim 21 wherein the programmable logic device employs a state machine.

23. A bidirectional voltage translator according to claim 21 wherein the bidirectional translator circuit further comprises a clock, the clock coupled to the programmable logic device, the detecting circuitry comprises first and second comparators, the first comparator having a first input coupled to the first port, a second input coupled to a first voltage reference and an output coupled to the programmable logic device, the second comparator having a first input coupled to the second port, a second input coupled to a second voltage reference, and an output coupled to the programmable logic device, the translating circuitry comprises first and second transistors, the first transistor having a first terminal coupled to the programmable logic device and a second terminal coupled to the first port, the second transistor having a first terminal coupled to the programmable logic device and a second terminal coupled to the second port, and the programmable logic device comprises a first in port coupled to the output of the first comparator, a second in port coupled to the output of the second comparator, a first out port coupled to the first terminal of the first transistor and a second out port coupled to the first terminal of the second transistor.

24. A bidirectional voltage translator according to claim 23 wherein the bidirectional translator circuit further comprises:

a first pull-up circuit coupled to all of the first port, the first input of the first comparator and the second terminal of the first transistor, a second pull-up circuit coupled to all of the second port, the first input of the second comparator and the second terminal of the second transistor, a third pull-up circuit coupled to the output of the first comparator and the first in port of the programmable logic device, and a fourth pull-up circuit coupled to the output of the second comparator and the second in port of the programmable logic device.

25. A bidirectional voltage translator according to claim 23 wherein the first and second transistors are open-collector bipolar junction transistors, the first terminal of the first and second transistors are bases, and the second terminal of the first and second transistors are collectors.

* * * * *